United States Patent
Davis et al.

(10) Patent No.: US 8,232,212 B2
(45) Date of Patent: Jul. 31, 2012

(54) WITHIN-SEQUENCE METROLOGY BASED PROCESS TUNING FOR ADAPTIVE SELF-ALIGNED DOUBLE PATTERNING

(75) Inventors: Matthew F. Davis, Felton, CA (US);
Thorsten B. Lill, Santa Clara, CA (US);
Lei Lian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1040 days.

(21) Appl. No.: 12/172,106

(22) Filed: Jul. 11, 2008

(65) Prior Publication Data

US 2010/0009470 A1    Jan. 14, 2010

(51) Int. Cl.
*H01L 21/302* (2006.01)
(52) U.S. Cl. ........ 438/696; 438/717; 438/718; 438/736; 216/59; 216/60
(58) Field of Classification Search .................. 438/696, 438/717, 718, 736; 216/59, 60
See application file for complete search history.

(56) References Cited

U.S. PATENT DOCUMENTS

| | | | |
|---|---|---|---|
| 6,426,502 B1 | 7/2002 | Finarov | |
| 6,673,199 B1 | 1/2004 | Yamartino et al. | |
| 6,733,619 B2 | 5/2004 | Finarov | |
| 6,791,686 B1 | 9/2004 | Finarov | |
| 2003/0106642 A1* | 6/2003 | Fairbairn et al. | 156/345.24 |
| 2007/0023390 A1 | 2/2007 | Kumar | |
| 2008/0076070 A1* | 3/2008 | Koh et al. | 430/311 |
| 2009/0286397 A1* | 11/2009 | Sadjadi | 438/680 |

FOREIGN PATENT DOCUMENTS

KR    10-0310257    9/2001

OTHER PUBLICATIONS

International Search Report and Written Opinion for PCT Application No. PCT/US2009/050264 mailed Mar. 10, 2010, 7 pgs.
International Preliminary Report on Patentability for Application No. PCT/US2009/050264 dated Jan. 11, 2011, 5 pages.

* cited by examiner

*Primary Examiner* — Binh X Tran
(74) *Attorney, Agent, or Firm* — Blakely, Sokoloff, Taylor & Zafman

(57) ABSTRACT

An apparatus for adaptive self-aligned dual patterning and method thereof. The method includes providing a substrate to a processing platform configured to perform an etch process and a deposition process and a metrology unit configured for in-vacuo critical dimension (CD) measurement. The in-vacuo CD measurement is utilized for feedforward adaptive control of the process sequence processing platform or for feedback and feedforward adaptive control of chamber process parameters. In one aspect, a first layer of a multi-layered masking stack is etched to form a template mask, an in-vacuo CD measurement of the template mask is made, and a spacer is formed, adjacent to the template mask, to a width that is dependent on the CD measurement of the template mask.

16 Claims, 7 Drawing Sheets

WITHIN-SEQUENCE METROLOGY BASED PROCESS TUNING FOR ADAPTIVE SELF-ALIGNED DOUBLE PATTERNING

BACKGROUND

1) Field

Embodiments of the present invention pertain to the field of Semiconductor Processing and, in particular, to self-aligned double patterning (SADP).

2) Description of Related Art

FIGS. 1A-C illustrate cross-sectional views of a conventional semiconductor lithographic process. Referring to FIG. 1A, a photoresist layer 104 is provided above a semiconductor stack 102. A mask or reticle 106 is positioned above photoresist layer 104. A lithographic process includes exposure of photoresist layer 104 to radiation (hv) having a particular wavelength ($\lambda$), as indicated by the arrows in FIG. 1A. Referring to FIG. 1B, photoresist layer 104 is subsequently developed to remove the portions photoresist layer 104 that were exposed to light and thereby provide patterned photoresist layer 108 above semiconductor stack 102. The width of each feature of patterned photoresist layer 108 is depicted by the width 'x' of a feature and the space 'y' between each feature. The width 'x' added to space 'y' is referred to as the pitch, p.

Referring to FIG. 1C, the CD, or width 'x,' of a feature may be reduced to form patterned photoresist layer 110 above semiconductor stack 102. The CD may be shrunk, or "biased" by over-exposing photoresist layer 104 during the lithographic step depicted in FIG. 1A or by trimming patterned photoresist layer 108 provided in FIG. 1B. However, this reduction in feature CD comes at the expense of an increased spacing between features, as depicted by spacing 'y' in FIG. 1C.

The resolution limit for a particular lithographic process is characterized with features having a critical dimension (CD) equal to the space between the features (e.g., x=y, as depicted in FIG. 1B with both x and y being equal to the "half-pitch."). A conventional 193 nm lithography system may provide a minimum pitch, p, of 130 nm and a 65 nm half pitch. To reduce the effective half pitch of patterns formed in a substrate, density-sensitive integrated circuit (IC) product lines, such as dynamic random access memory (DRAM), are pursuing double patterning (DP). Generally, DP methods successively lithographically pattern a substrate twice with each patterning operation performed with a different mask and a relaxed half-pitch. The two resulting patterns interlace to compose features on the substrate having a half pitch smaller than that of either individual pattern. The composition of the two patterns is then transferred into the substrate to define a pattern in the substrate having a half pitch below that lithographically achievable with the particular lithography employed (e.g., "sub-minimum half-pitch").

Because DP methods are relatively independent of the lithographic technology employed, they can be practiced with 193 nm lithography as well as high NA or EUV lithography to provide a sub-minimum half pitch. DP methods however are potentially cost prohibitive, particularly as a result of production cycle time, which increases when a DP method employs many additional operations to pattern a particular layer.

SUMMARY

Embodiments of the present invention include methods of within-sequence metrology-based tuning for adaptive self-aligned dual patterning (SADP). In an embodiment, an in-vacuo metrology, such as in-vacuo optical CD (OCD) measurement, is integrated with a processing platform in an integrated SADP process. In embodiments, one or more in-vacuo metrology operations, performed between process operations, provide either or both feedback and feedforward parameters for adaptively determining a chamber sequence in an SADP process or for adaptively adjusting process parameters employed in particular operations of an integrated SADP process sequence.

In an embodiment, a first substrate is loaded into a processing platform, a first layer of a multi-layered masking stack is etched to form a template mask, an in-vacuo CD measurement of the template mask is performed and a spacer is formed, adjacent to the template mask, to a width that is dependent on the CD measurement of the template mask. The first substrate is subsequently unloaded from the processing platform. In an exemplary embodiment, the in-vacuo CD measurement is an optical CD (OCD) measurement.

In one embodiment, the spacer is formed adjacent to the template mask by first depositing, over the template mask, a layer of material with a thickness dependent on the CD measurement of the template mask. A spacer etch is then performed to expose the template mask and to form a spacer. An in-vacuo CD measurement may performed to determine the deposited layer thickness and, depending on the measurement, either supplementing the thickness of the deposited layer with a redeposition or isotropically etching the deposited layer, prior to anisotropically etching the deposited layer to form the spacer. In embodiments, at least one process parameter of the film deposition is based on the in-vacuo CD measurement of the template mask or at least one process parameter of the anisotropic etch is based on the in-vacuo CD measurement of the deposited layer thickness. Dependent parameters may include, for example, a process time, a process gas flow, an inner:outer RF source coil power ratio, an inner:outer electrode temperature ratio, an inner/out gas flow ratio and a magnetic field strength.

In another embodiment, a first and second substrate is loaded into a processing platform, a first feature is etched into a layer over the first substrate. A first in-vacuo OCD measurement of the first feature is then performed and a first film is then deposited over the first feature. The first etch chamber is further employed to etch a second feature into a layer over the second substrate. In one embodiment, a process parameter of the first film deposition and a process parameter of the second feature etch are both dependent on the first OCD measurement. In a further embodiment, the second feature CD is then characterized with a second in-vacuo OCD measurement and the first CVD chamber deposits a film over the second feature using deposition parameters dependent on at least one of the first or second in-vacuo OCD measurements. The first and second substrates are then unloaded from the processing platform as substrates having a self-aligned, double pattern.

Embodiments of a plasma processing platform include a transfer chamber configured to operate at sub-atmospheric pressures, one or more process chambers configured to perform an etch and a deposition coupled to the transfer chamber, a metrology unit configured for in-vacuo critical dimension measurement coupled to either the transfer chamber or a process chamber, and one or more controllers configured to process substrates through the one or more process chambers, wherein at least one deposition process parameter is determined by the one or more controllers based on a CD measurement received from the metrology unit after the substrate is etched.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
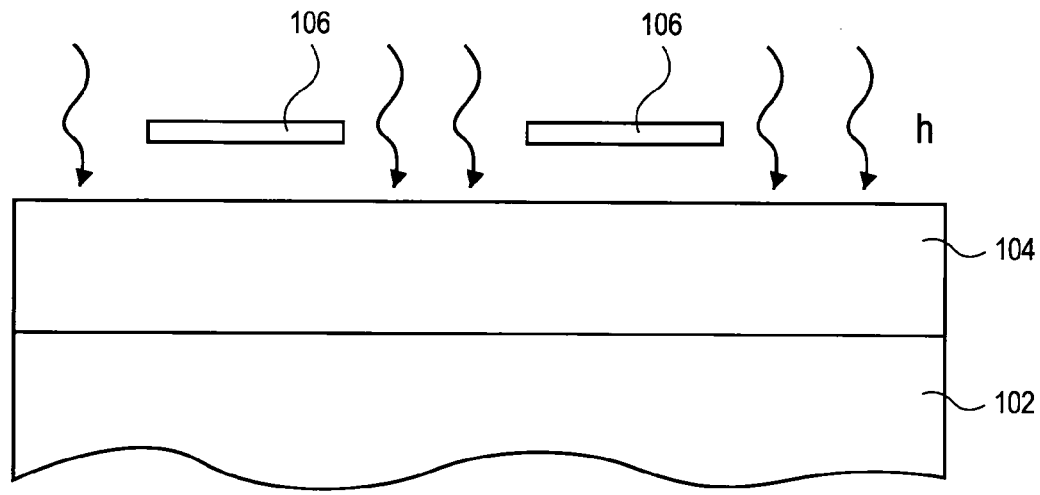
FIG. 1A-1C illustrate a conventional means of biasing a feature to reduce critical dimensions.
Figure 1B:
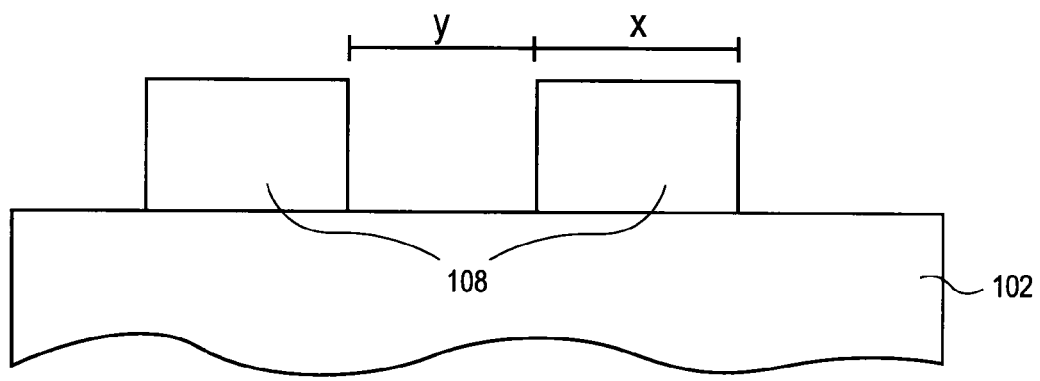
Figure 1C:
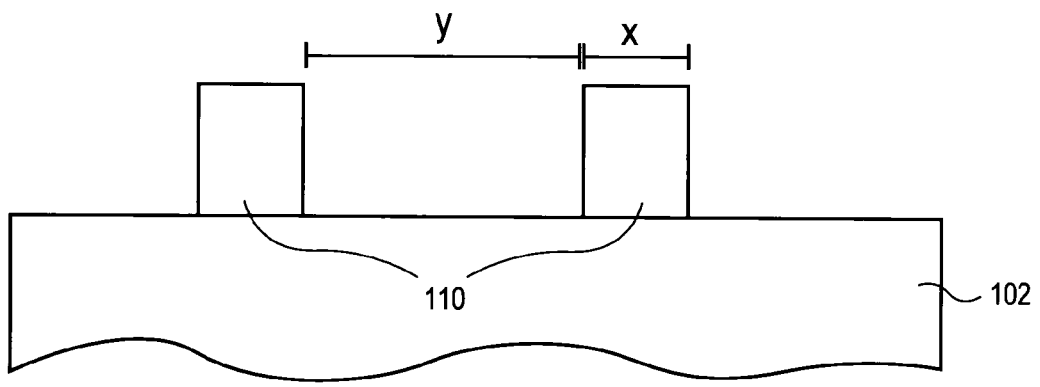

Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. In the following description, numerous specific details are set forth, such as fabrication conditions and materials, to provide a thorough understanding of the present invention. However, particular embodiments may be practiced without one or more of these specific details, or in combination with other known methods, materials and apparatuses. Furthermore, the particular features, structures, materials, or characteristics described may be combined in any suitable manner in one or more embodiments. It should also be understood that specific embodiments may be combined where not mutually exclusive. The accompanying Figures are illustrative representations and not necessarily drawn to scale.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a substrate without consideration of the absolute orientation of the substrate.

Some portions of the detailed descriptions which follow are presented in terms of algorithms and symbolic representations of operations on data bits within a computer memory. Unless specifically stated otherwise, as apparent from the following discussion, it is appreciated that throughout the description, discussions utilizing terms such as "displaying", "receiving", "consolidating", "generating", "updating", or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

SADP is generally a multi-step hardmask process in that the final mask over the substrate is not of photosensitive material. SADP utilizes a sequence of etch and deposition process operations capable of forming, from a single lithographically defined mask, a double pattern having a pitch and/or CD reduced from that lithographically printed. For example, in accordance with an SADP process, a spacer mask is fabricated having spacer lines formed adjacent to the sidewalls of a template mask. For every line of the template mask, two spacer mask lines are generated. A spacer mask providing substantially the same critical dimension (or less) for each line, but having double the density of lines in a particular region, may thus be fabricated.

It has been found that the process operations employed in SADP processes require more rigorous process control than process sequences conventional performed in the fabrication of integrated circuits (IC), or the like. To achieve such process control, advantageous embodiments integrate one or more process chambers with an in-vacuo metrology unit onto a single mainframe. The one or more process chambers being configured to perform both etch and deposition processes. While there may not necessarily be a physical requirement to maintain a substrate in vacuum condition throughout the integrated SADP process (e.g., to prevent native oxide formation, etc.), integration onto a single mainframe may nonetheless improve process control because the various processes can be managed and adaptively controlled in a closed loop fashion. A SADP process can then be managed as a unit operation taking a lithographically defined masked substrate as an input (e.g., platform entrance load lock) and outputting a hardmasked substrate (e.g., platform exit load lock). The CD and pitch reduction effected by the integrated SADP process may then be adaptively controlled within the scope of a single mainframe as opposed to a factory-wide solution requiring management and execution system (MES) level integration of separate unit operations, cross-functional manufacturing and engineering teams, etc.

As an integrated processing platform, control of an integrated SADP process may be improved by adapting to variation in individual processes rather than merely independently controlling each of a number of stand-alone processes to a minimal level of variation. For example, a particular etch process with a small process window resulting in CD non-uniformity that is somewhat higher than ideal (e.g., a BARC layer etch) may nonetheless be successfully employed where a subsequent process with a larger process window may be adaptively tuned to improve the CD non-uniformity (e.g., BARC feature trim).

Figure 2:
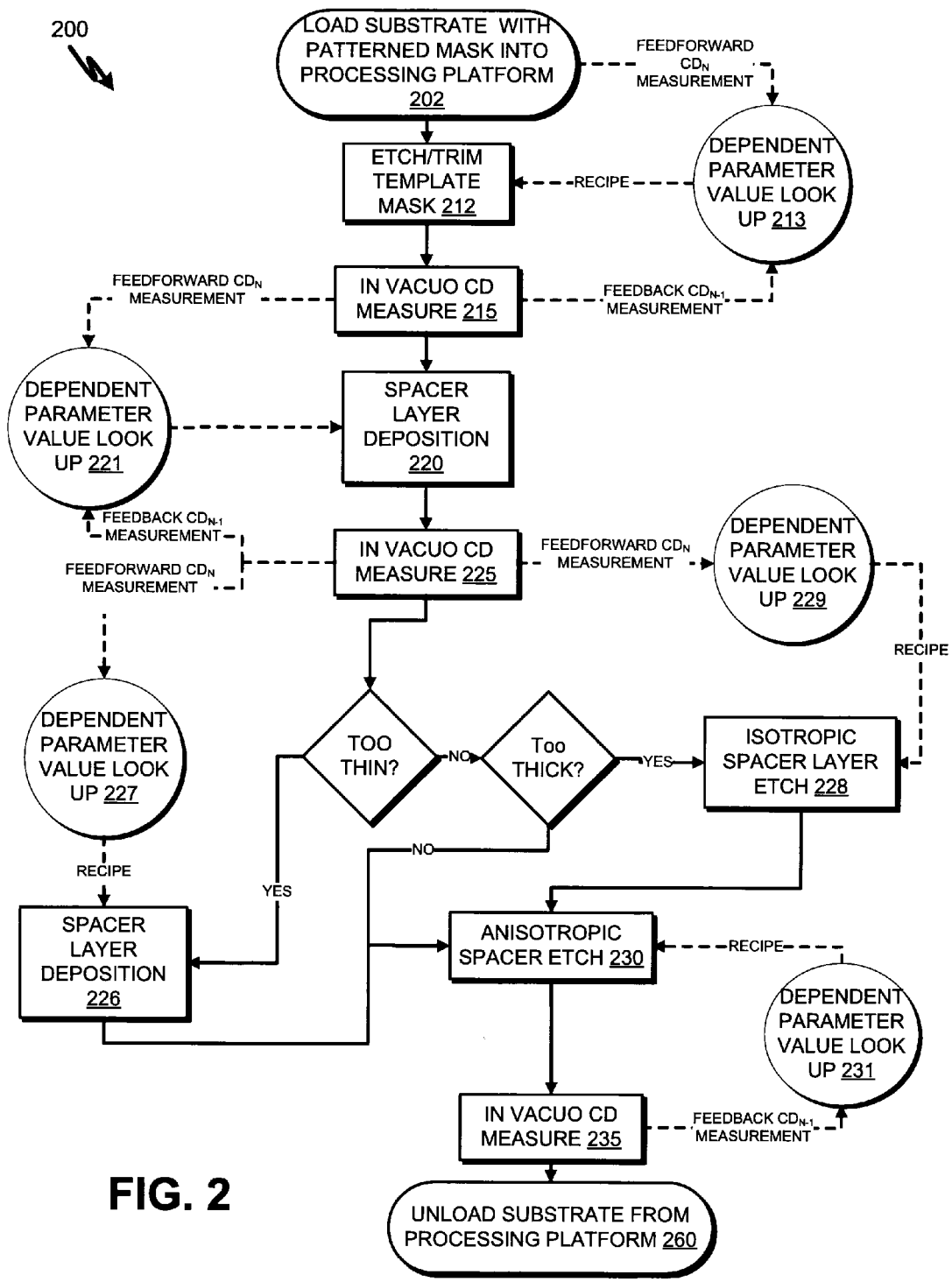
FIG. 2 illustrates a flow diagram of an adaptive SADP process, in accordance with an embodiment of the present invention.
Figure 3A:
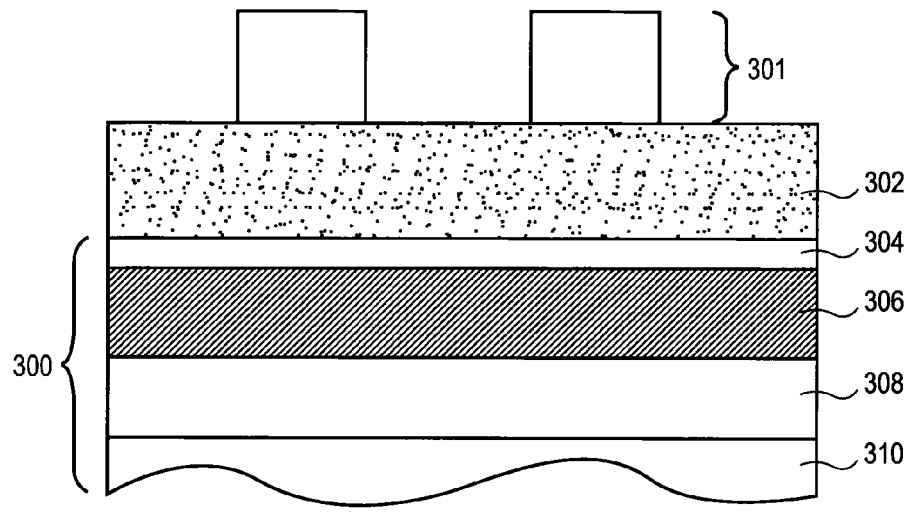
FIGS. 3A-3H illustrate cross-sectional views representing a series of operations in a SADP process, in accordance with an embodiment of the present invention.
Figure 4:
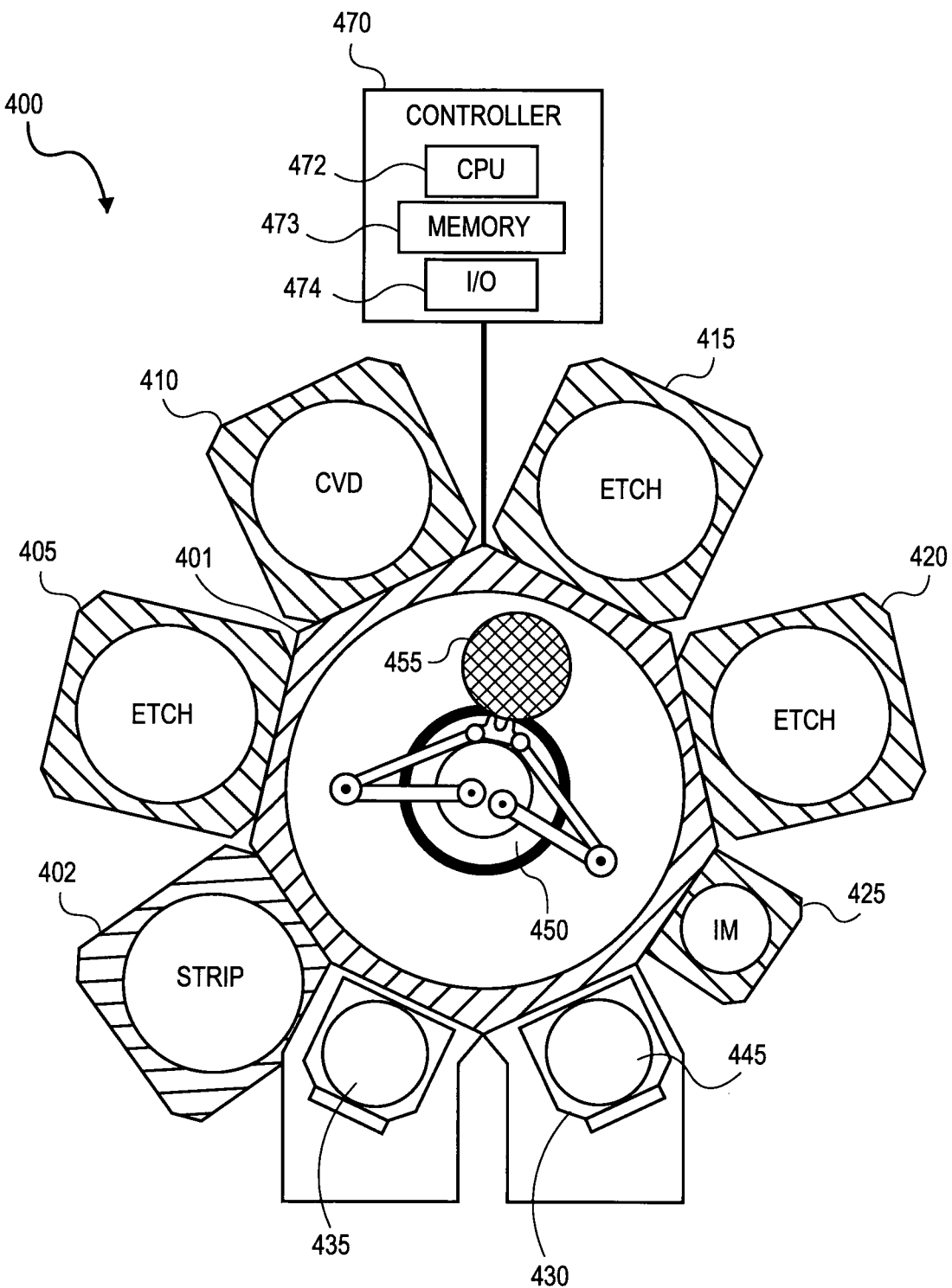
FIG. 4 illustrates a multi-chambered integrated SADP processing platform including integrated in-vacuo metrology, in accordance with an embodiment of the present invention.
Figure 5:
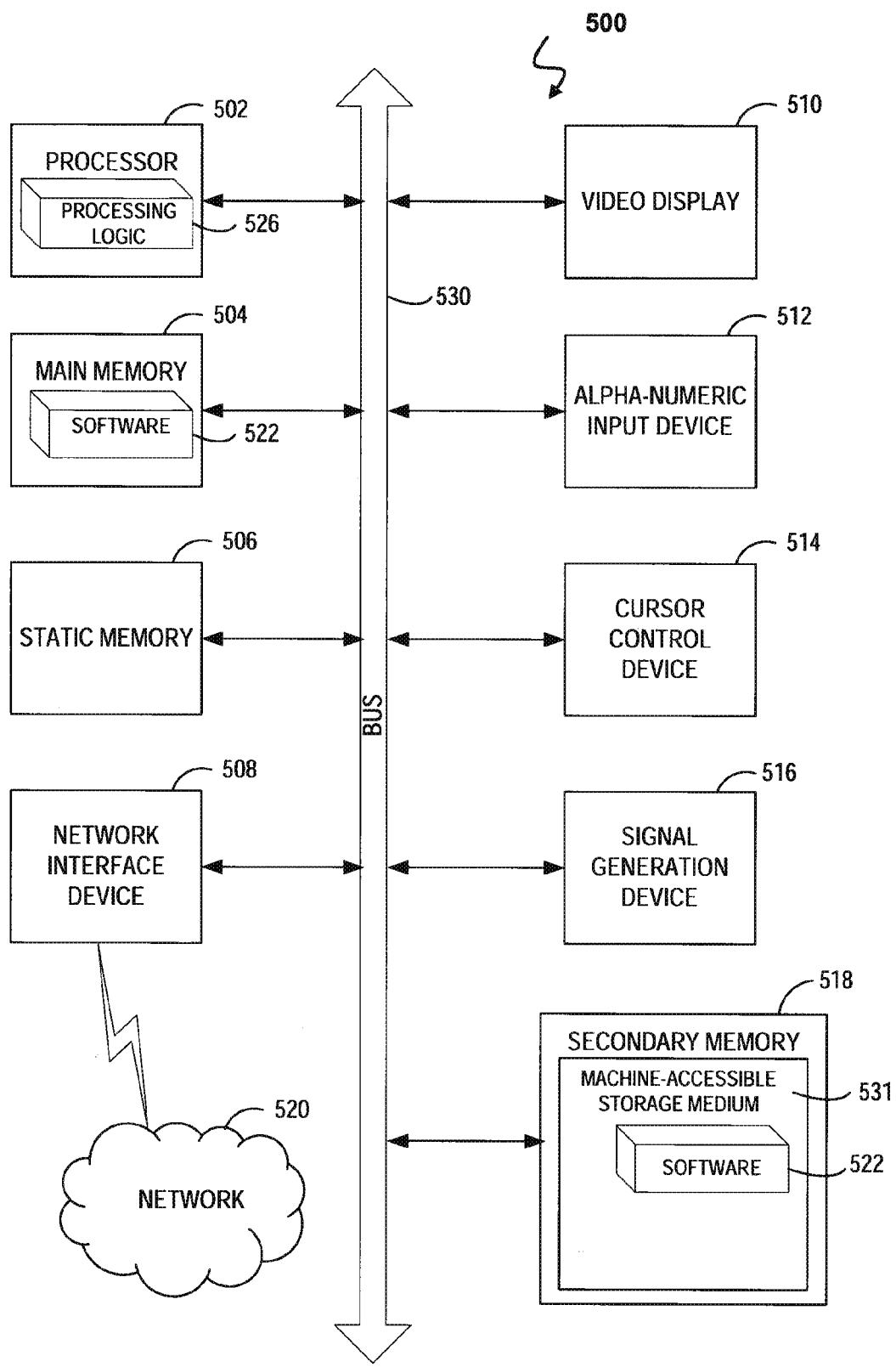
FIG. 5 illustrates a block diagram of an exemplary computer system, in accordance with one embodiment of the present invention.

While embodiments of the present invention are applicable to a number of complex process sequences, FIG. 2 illustrates a flow diagram of an exemplary adaptive SADP process 200 employing a plurality of within-sequence metrology operations. In particular embodiments, any one of the metrology operations described for the adaptive SADP process 200 may be employed without the others, depending on the variability of particular processes of an SADP sequence. FIGS. 3A-3G provide further illustration of a substrate as it is worked through particular operations of the adaptive SADP process 200. FIG. 4 depicts an exemplary multi-chambered processing platform 400, configured to perform an integrated process, such the adaptive SADP process 200. FIG. 5 depicts an exemplary computer system which may be configured as a controller of an integrated processing platform, such as the multi-chambered processing platform 400.

Referring first to FIG. 4, the multi-chambered processing platform 400, may be any platform known in the art that is capable of adaptively controlling a plurality of process modules simultaneously. Exemplary embodiments include an Opus™ AdvantEdge™ system or a Centura™ system, both commercially available from Applied Materials, Inc. of Santa Clara, Calif.

Embodiments of the present invention further include a metrology (IM) chamber integrated into a processing platform, such as the IM chamber 425 of the multi-chambered processing platform 400. While depicted as a dedicated module coupled directly coupled to a transfer module 401, the IM chamber 425 may also be integrated into one or more of the process chambers 402, 405, 410, 415 or 420. The IM chamber 425 provides control signals to allow adaptive control of an integrated etch and/or deposition process, such as the adaptive SADP process 200 of FIG. 2. The IM chamber 425 may include any metrology which is capable of measuring CD and/or feature pitch as well as CD and/or feature pitch uniformity under vacuum (in-vacuo) in an automated manner. Examples include, but are not limited to, optical techniques like reflectometry and scatterometry, or electron microscopy techniques like SEM. In particularly advantageous embodiments, in-vacuo optical CD (OCD) techniques are employed.

OCD techniques referred to herein may also be known as scatterometry and offer the potential to characterize parameters of a substrate during a manufacturing process. In practice, light is directed onto a periodic grating formed on a substrate and a spectrum of reflected light is measured and analyzed to characterize the grating parameters. Characterization parameters may include critical dimensions (CD), sidewall angle (SWA), feature height (HT) and any others which vary a material's reflectivity and refractive index. Characterization of the grating may thereby characterize the substrate as well as provide a basis for adaptively controlling the process chambers 402, 405, 410, 415 and 420 employed in the formation of the grating and other substrate features.

The process chambers 402, 405, 410, 415 and 420 perform particular operations on a substrate, such as film removal in the strip chamber 402, film patterning in the etch chambers 405, 415 and 420 and film deposition in the CVD chamber 410. Exemplary plasma etch chambers include the DPS AdvantEdge, E-MAX® or Enabler™, all manufactured by Applied Materials of CA, USA. Exemplary deposition chambers include DxZ™ and XT Producer™, also manufactured by and commercially available from Applied Materials of CA, USA. It is to be understood that other etch and deposition chambers can also be used for practicing embodiments of the present invention.

In an alternative embodiment (not pictured) any one of the process chambers coupled to a platform including IM is configured to perform both etch and deposition operations. For example, in the multi-chamber processing platform 400, etch chambers 405, 415 and 420 may be further configured to also perform the film deposition of the CVD chamber 410. In such an embodiment, any one or more of the film deposition processes described elsewhere herein may be performed within the same chamber as any one of the etch processes described elsewhere herein. Thus, the process control methodologies described in the context of a separate etch and deposition chambers are, in alternative embodiments, performed between recipe steps of a process chamber configured to perform both etches and film depositions.

As further depicted in FIG. 4, the multi-chambered processing platform 400 further includes a substrate aligner chamber 425, as well as load lock chambers 430 holding cassettes 435 and 445, coupled to the transfer chamber 401 including a robotic handler 450.

Embodiments of the present invention further include adaptive control of process chamber recipe parameters and adaptive control of the process chamber sequences to which a particular substrate is exposed during an integrated process (e.g., adaptive SADP process 200). In one exemplary embodiment, the adaptive control of process recipe parameters and adaptive control of the process sequences is performed on the multi-chambered processing platform 400 via a controller 470. The controller 470 may be one of any form of general-purpose data processing system that can be used in an industrial setting for controlling the various subprocessors and subcontrollers. Generally, the controller 470 includes a central processing unit (CPU) 472 in communication with a memory 473 and an input/output (I/O) circuitry 474, among other common components. Software commands executed by the CPU 472, cause the multi-chambered processing platform 400 to, for example, load a substrate into the etch chamber 405 and execute an etch process.

In embodiments, the adaptive control of chamber processes and chamber sequences is dependent upon substrate measurement data generated by the IM chamber 425. The controller 470 may access a look up table stored in the memory 473 to determine a process parameter based on measurement data from the IM chamber 425. In some embodiments, a statistical process model, such as a neural network model, may be stored in the memory 473 and accessed by the controller 470 to adaptively determine an etch or deposition process parameter based on CD measurement inputs from the IM chamber 425. An exemplary closed loop process control system employing OCD control signals is the Transforma™, commercially available from Applied Materials, Inc.

In one embodiment, the processing time of at least one operation in an adaptive SADP process is dependent on an in-vacuo CD measurement performed by the IM chamber 425 either on that same substrate (e.g., feedforward control signal) or on a previously processed substrate (e.g., feedback control signal). In other exemplary embodiments, a process parameter, such as, but not limited to process pressure, total RF power, gas flow, a source:bias RF power ratio, an inner:outer RF source coil power ratio, an inner:outer electrode temperature ratio, an inner:outer gas flow ratio or a magnetic field strength, is tuned to a setpoint based on, dependent on, or in response to, an in-vacuo CD measurement made during an adaptive SADP process. Such adaptive control may serve to correct an inaccurate or imprecise (highly non-uniform) intermediate CD.

In an exemplary embodiment, a process of an adaptive SADP process is tuned, in response to an in-vacuo CD measurement, by modulating either or both of a charged and a neutral plasma species density across a substrate diameter. For example, in a plasma etch chamber which includes a charged species tuning unit (CSTU) capable of applying a magnetic field of variable strength across a substrate diameter, a CSTU value may be set based on an in-vacuo CD measurement from the IM chamber 425. One exemplary CSTU value includes a first magnetic coil proximate a periphery of a substrate and second magnetic coil proximate a center of the substrate to provide a magnetic field of between 0 G and about 25 G in either or both of an inner zone and outer zone of any of the etch chambers 405, 415 or 420. The uniformity of CD may be modulated with control of the CSTU to reduce a "W" or "M" characteristic across the substrate diameter. The "W" or "M" refers to a variation in the etch performance across a substrate diameter, where for example an etch rate or bottom CD may be high or low at the substrate center and edge as compare to at a half radius of the substrate.

In another exemplary embodiment, a neutral species tuning unit (NSTU), which allows a gas to be introduced into the etch chamber at different volumetric flow rates across a diameter of the wafer, may be further employed to tune an etch process (e.g., to enlarge the bottom CD of an etched space or feature) based on an in-vacuo CD measurement. When used in combination, particular settings of the CTSU perform well with particular setting of the NSTU, such that a high inner:outer diameter gas flow ratio may benefit from a relatively higher inner:outer magnetic field ratio. For example, in one implementation where an etchant gas mixture is implemented with an "inner only" setting of NSTU, a CSTU with a mixed inner:outer diameter magnetic flux ratio of approximately 12 G inner:8 G outer was found to provided improved across wafer etch uniformity, reducing a "W" or "M" etch characteristic.

In another exemplary embodiment, a process of an adaptive SADP process is tuned, in response to an in-vacuo CD measurement, with hardware configuration setpoints modulating the substrate temperature. For certain layers etched in an adaptive SADP process, the etch rate may be manipulating with the substrate temperature. Furthermore, it is possible in an etch apparatus providing multiple temperature control zones to further tune an etch rate across a substrate diameter to improve a CD uniformity. With such a dual zone system, a inner:outer electrode temperature ratio may be tuned for a particular substrate based on an in-vacuo CD measurement. For example, in the etch chamber 415, a temperature of the substrate 455 at a point proximate to the substrate center may be controlled to first setpoint, such as 20° C. while controlling the temperature of the substrate at a point proximate to the substrate periphery to a second setpoint, such as 25° C., to improve across-wafer uniformity of an amorphous carbon layer etch.

Returning to FIG. 2, the adaptive SADP process 200 begins at the operation 202 with loading of a first substrate into a processing platform. In one exemplary embodiment, the processing platform is the multi-chamber processing platform 400 of FIG. 4. As further depicted in FIG. 3A, over the first substrate is a photoresist mask 301 which may be composed of a material suitable for use in a lithographic process. In a specific embodiment, the photoresist mask 301 is composed of a positive photoresist material such as, but not limited to, a 248 nm resist, a 193 nm resist, a 157 nm resist, an extreme ultra-violet (EUV) resist or a phenolic resin matrix with a diazonaphthoquinone sensitizer. In another embodiment, the photoresist mask 301 is composed of a negative photo-resist material such as, but not limited to, poly-cis-isoprene or poly-vinyl-cinnamate.

Below the photoresist mask 301 is a template mask precursor layer 302 disposed above a stack 300; stack 300 including a substrate 310 and layers 304, 306 and 308 thereon. In an exemplary embodiment, the stack 300 includes a stop layer 304, a first hardmask layer 306 and a device layer 308, as depicted in FIG. 3A. In accordance with an embodiment of the present invention, at least a portion of the stack 300 will ultimately be patterned as an SADP hardmask. In a particular embodiment, the stop layer 304 and the first hardmask layer 306 are removed following a patterning of the device layer 308 which is ultimately retained.

The template mask precursor layer 302 may be of a material suitable for patterning by an etch process using the photoresist mask 301 and suitable for withstanding a subsequent spacer mask formation process. In accordance with an embodiment of the present invention, template mask precursor layer 302 is a bottom anti-reflective coating (BARC), such as one including polyamides or polysulfones and have less than 5 wt % carbon. However, other insulator or semiconductor materials may be used. For example, in another embodiment, the template mask precursor layer 302 is of a material such as, but not limited to, amorphous silicon, silicon nitride, silicon oxide, germanium, silicon-germanium or poly-crystalline silicon.

The stop layer 304 may be of any material which may withstand etching of the template mask precursor layer 302. In an advantageous embodiment, the material of the stop layer 304 is also able to withstand an etch process used to form a spacer mask, e.g., suitable to protect the first hardmask layer 306 during formation of a spacer mask as well as improve adhesion of the stop layer 304 applied by spin on techniques (e.g., BARC), which may otherwise not adhere well to the first hardmask layer 306. In one embodiment, the stop layer 304 is composed of a material such as, but not limited to, silicon oxide, silicon nitride, silicon oxy-nitride or silicon carbon nitride. The thickness of the stop layer 304 may be sufficiently thick to inhibit the formation of pinholes that may undesirably expose the first hardmask layer 306 to an etch process used to form a template mask, form a spacer mask or used to remove a template mask, as described elsewhere herein. In one embodiment, the thickness of the stop layer 304 is in the range of 15-40 nanometers.

The first hardmask layer 306 may be of any material suitable to form a patterning mask based on the transferred image of a spacer mask. For example, in a accordance with an embodiment of the present invention, the first hardmask layer 306 is a carbonaceous layer. As used herein, a carbonaceous layer includes inorganic layers comprising at least 20 wt % carbon. Included in this class of materials is amorphous carbon, typically comprising greater than 50 wt % carbon, and low-k dielectrics comprising at least 20 wt % carbon content. Excluded from the "carbonaceous" class are organic materials having a total carbon content less than 20 wt %, such as those commonly employed as bottom anti-reflective coating (BARC) layers. An exemplary amorphous carbon material is commercially available from Applied Materials, Inc., CA, U.S.A. under the trade name Advanced Patterning Film™ (APF). Though not depicted, in another embodiment at the lower end of the carbon wt % range, the carbonaceous layer is a low-k dielectric, such as that commercially available from Applied Materials, Inc., under the trade name of Black Diamond™.

The first hardmask layer 306 may be formed with spray-on/spin-on methods or with CVD (e.g., plasma enhanced CVD) process. In the embodiment depicted in FIG. 3A, the first hardmask layer 306 is deposited with by CVD to form a carbon material comprising at least 50 wt % carbon with sp1, sp2 and sp3 bonding states giving the film properties which are a hybrid of those typical of pyrolylic, graphitic, and diamond-like carbon. The first hardmask layer 306 may be any thickness suitable to provide a practical aspect ratio for use in a subsequently formed patterning mask. In a particular embodiment, the thickness of the first hardmask layer 306 is in the range of 3.125-6.875 times the targeted width of each of the lines of a subsequently formed SADP hardmask.

The device layer 308 may be any layer desirable for device fabrication or any other structure fabrication requiring a self-aligned dual patterning integration scheme (e.g. semiconductor device structures, MEMS structures and metal line structures) while the substrate 310 may be composed of any material which can withstand a manufacturing process and upon which material films may suitably be disposed. In an embodiment, the substrate 310 is composed of group IVbased materials such as, but not limited to, crystalline silicon, germanium or silicon/germanium. In another embodiment, the substrate 310 is composed of a III-V material. The substrate 310 may also include an insulating layer. In one embodiment, the insulating layer is composed of a material such as, but not limited to, silicon nitride, silicon oxy-nitride or a high-k dielectric layer. In an alternative embodiment, the substrate 310 is a flexible plastic sheet.

Figure 3B:
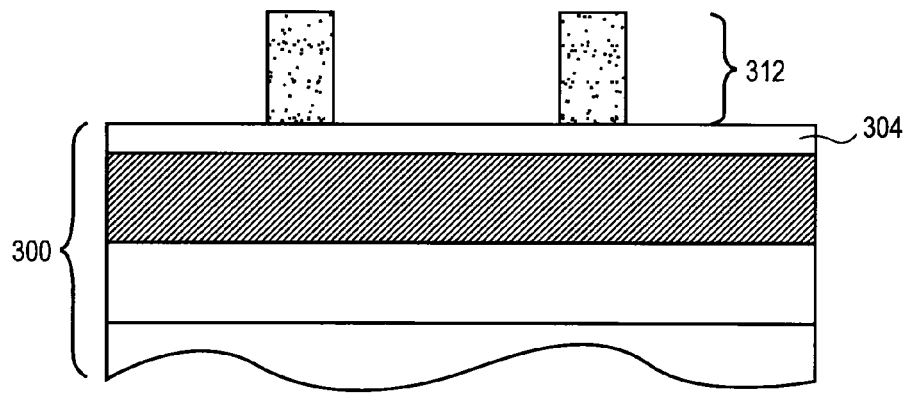

After substrate loading, the substrate is transferred into a first etch chamber (e.g., etch chamber 405 of FIG. 4) and the operation 212 of FIG. 2 is performed to form a template mask 312 depicted in FIG. 3B. In accordance with an embodiment of the present invention, the pattern of the photo-resist mask 301 is etched into the template mask precursor layer 302 selectively to the stop layer 304. In one embodiment, etching of the template mask precursor layer 302 includes trimming of at least one of the photoresist mask 301 or the template mask 312. Generally, trimming refers to an etch which narrows the lateral CD. In a first embodiment, the photoresist mask 301 is trimmed prior to etching the template mask precursor layer 302. In one such embodiment, the photoresist mask 301 is trimmed with a process recipe including a parameter determined from the lookup table 213 based on an incoming CD measurement, such as an in-atmosphere or in-vacuo measurement. The incoming CD measurement provides feedforward CD measurement data ($CD_N$) of the substrate to be etched at the operation 212. Any of the process parameters previously described in the context of FIG. 4 may be tuned through recipe values determined from lookup table 213, based on the feedforward $CD_N$ measurement. For example, where a fixed etch time is employed, the time the photoresist mask 301 is trimmed may be tuned based on the feedforward $CD_N$ measurement.

Following the trim process, the template mask precursor layer 302 is etched to expose, or "open" the stop layer 304, as further depicted in FIG. 3B. The image of photo-resist mask 301 is transferred into the template mask precursor layer 302 by any etch process suitable to provide approximately vertical sidewalls for the features of template mask 312, as depicted in FIG. 3B. The etch process may similarly include a recipe parameter determined based on the feedforward CD measurement, $CD_N$. In one embodiment, where the template mask precursor layer 302 is BARC, the photoresist mask 301 is completely consumed by the end of the BARC etch. In an alternate embodiment, a trim of the template mask 312 is performed during an over etch to narrow the CD of the template mask 312, clean up residue of the photoresist mask 301 and/or smooth the sidewall of the template mask 312.

Following the operation 212, an in-vacuo CD measurement is performed at an operation 215. Any of the measurement techniques described in reference to FIG. 4 may be employed at the operation 215. In a particular embodiment, an in-vacuo OCD measurement is performed to generate feedback CD measurement data ($CD_{N-1}$) which is input into an adaptive controller of the operation 212 (e.g., via the look up table 213) for etching or trimming a subsequent substrate. Thus, the etch process at the operation 212 may be performed with a process parameter that is tuned based on both a feedforward $CD_N$ measurement (substrate to be processed) and a feedback $CD_{N-1}$ measurement (substrate previously processed).

Figure 3C:
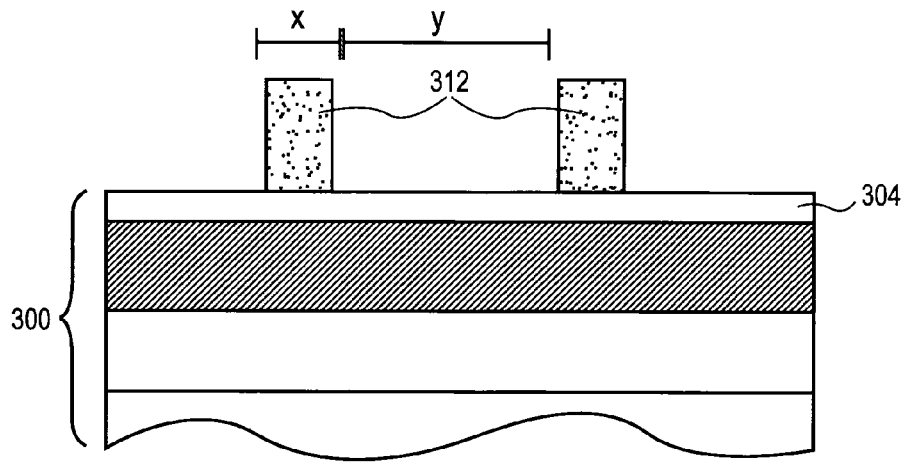

Referring to FIG. 3C, the height of the template mask 312 may be sufficiently short to prevent spacer mask line-collapse of a subsequently formed spacer mask formed thereon and sufficiently tall to enable critical dimension control of the spacer mask lines. In one embodiment, the height of the template mask 312 is approximately in the range of 4.06- 5.625 times the targeted line width of a subsequently formed spacer mask. The lateral width of the template mask 312 may be a CD suitable for use in a spacer mask fabrication process. In accordance with an embodiment of the present invention, the template mask 312 is etched to a CD 'x' of each feature to be substantially the same as the desired critical dimension of a subsequently formed feature in the device layer 308. For example, in one embodiment, the width 'x' is selected to be the desired critical dimension of a gate electrode. In one embodiment, the width 'x' is approximately in the range of 10-100 nanometers. The spacing 'y' may be selected to optimize the SADP process. That is, to accommodate a subsequently fabricated spacer mask where the width of the spacer lines are approximately equal to the width 'x'. Thus, the spacing between subsequently formed spacer lines may be targeted to be approximately equal to the width 'x'. In one embodiment, where the frequency of lines in the template mask 312 will ultimately be doubled, the spacing 'y' is approximately equal to 3 times the value 'x,' as depicted in FIG. 3C.

Figure 3D:
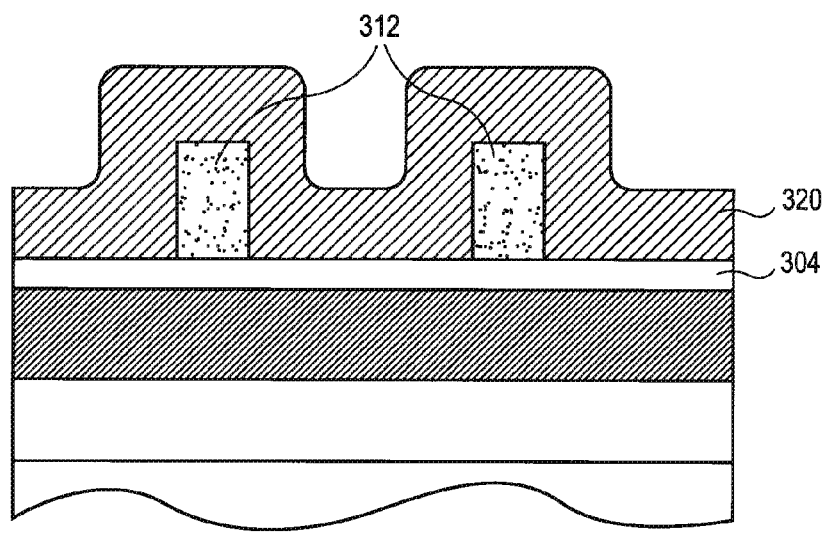

At operation 220 of FIG. 2, a film is the deposited on the etched substrate. For example, FIG. 3D depicts an exemplary embodiment where a spacer layer 320 is deposited conformally over the template mask 312 and the stop layer 304. In one exemplary embodiment, the CVD chamber 410 of FIG. 4 deposits spacer layer 320. In an embodiment, at least one process parameter of the spacer layer deposition of the operation 220 is adaptively determined based on at least one in-vacuo CD measurement. In one exemplary embodiment, adaptive control is provided based on the in-vacuo CD measurement of the operation 215. Data received from the operation 215 may used in the look up table 221 to determine at least one process parameter of the spacer layer deposition of the operation 220. Any of the process parameters previously described in the context of FIG. 4 may be tuned with recipe values determined from the lookup table 221, based on the feedforward $CD_N$ measurement. For example, a deposition time may be determined based on the feedforward $CD_N$ measurement from the operation 215, as depicted in FIG. 2. Thus, the in-vacuo CD measurement data collected at the operation 215 may provide both a feedback signal ($CD_{N-1}$) and feedforward signal ($CD_N$) used in adaptively controlling two separate process chambers in the adaptive SADP process 200.

The spacer layer 320 may be of any material suitable to form a reliable mask for use in a subsequent etch process. In accordance with an embodiment of the present invention, the spacer layer 320 is of a material such as, but not limited to, silicon nitride, silicon dioxide, silicon oxynitride, silicon carbon nitride, amorphous silicon or poly-crystalline silicon. In one embodiment where the template mask 312 is BARC, the spacer layer 320 is silicon dioxide. The spacer layer 320 may be deposited by any process suitable to provide a conformal layer adjacent the sidewalls of the template mask 312, as depicted in FIG. 3D. In one embodiment, the spacer layer 320 is deposited by a CVD technique such as, but not limited to, molecular-organic CVD, low-pressure CVD or plasma-enhanced CVD. In an advantageous embodiment, a low temperature oxide process is employed to reduce thermal budget.

The thickness of the spacer layer 320 may be selected to determine the width of the features in a subsequently formed spacer mask. Thus, in accordance with an embodiment of the present invention, the thickness of the spacer layer 320 is approximately equal to the width of the template mask 312, e.g., approximately equal to width 'x', as depicted in FIG. 3D. Although the ideal thickness of the spacer layer 320 is the same as the width 'x', the initial targeted thickness of the spacer layer 320 may need to be slightly thicker to compensate for the etch process used to pattern the spacer layer 320. For example, the target thickness of the spacer layer 320 may need to be approximately 1.06 times the desired feature width of a subsequently formed spacer mask.

The target thickness for the film deposited at the operation 220 may be well controlled with the adaptive SADP process 200 through the use of adaptive process control based on an in-vacuo CD measurement performed at the operation 225. Any of the measurement techniques described in reference to FIG. 4 may be employed at the operation 225. In a particular embodiment, an in-vacuo OCD measurement is performed to generate feedback CD measurement data ($CD_{N-1}$) which is input into an adaptive controller of the operation 220 (e.g., via the look up table 221) to modify the deposition process employed for subsequent substrates. Thus, a pre-deposition in-vacuo CD measurement (e.g. the operation 215) and a post-deposition in-vacuo CD measurement (e.g. the operation 225) may be employed in the adaptive control of the film deposition performed at the operation 220.

In an embodiment, a particular process chamber of a processing platform is to selected based on the CD measurement from the operation 225. In an alternate embodiment, the chamber sequence is not dependent on the CD measurement from the operation 225, but a process parameter employed for subsequent processing of the measured substrate is dependent on the operation 225. For example, as depicted in FIG. 2, feedforward $CD_N$ measurement data from the operation 225 is evaluated to be either below target (e.g., too thin) or above target (e.g., too thick).

In one embodiment, if the CD measurement data indicates the spacer layer 320 is too thin, then the substrate may be returned to a deposition chamber (e.g., the CVD chamber 410 of FIG. 4) where additional spacer material may be deposited at operation 226 to supplement the thickness of the spacer layer 320. In such a situation, the CD measurement data is used as a feedforward control signal ($CD_N$) input to an adaptive controller of the deposition process at the operation 226. Any of the process parameters previously described in reference to FIG. 4 may be tuned via the look up table 227 based on the feedforward control signal $CD_N$, however in a particular embodiment a deposition time is adapted to approach a target thickness for the spacer layer 320 (e.g., 1.06 times the desired feature width of a subsequently formed spacer mask).

In another embodiment, if the CD measurement data indicates the spacer layer 320 is too thin, then the substrate may be transferred to an etch chamber (e.g., the etch chamber 415 of FIG. 4) where the spacer layer 320 may be isotropically etched at an operation 228 to reduce the thickness of the spacer layer 320. As further depicted in FIG. 2, the CD measurement data from the operation 225 is used as a feedforward control signal ($CD_N$) input to an adaptive controller of the etch process at the operation 228. Any of the process parameters previously described in reference to FIG. 4 may be tuned via the look up table 229 based on the feedforward control signal $CD_N$, however in a particular embodiment an isotropic etch time is adapted to approach a target thickness for the spacer layer 320 (e.g., 1.06 times the desired feature width of a subsequently formed spacer mask).

In an alternative embodiment where a processing platform includes a hybrid dep-etch chamber configured to perform both a film deposition and etch processes, the spacer layer 320 may be first deposited at the operation 220 in a hybrid dep-etch chamber and after the CD measurement of the operation 225 returned to a hybrid dep-etch chamber. The hybrid dep-etch chamber is then employed to either perform a redeposition on the spacer layer 320 or isotropic etch of the spacer layer 320 to reach a target thickness for spacer layer 320.

Figure 3E:
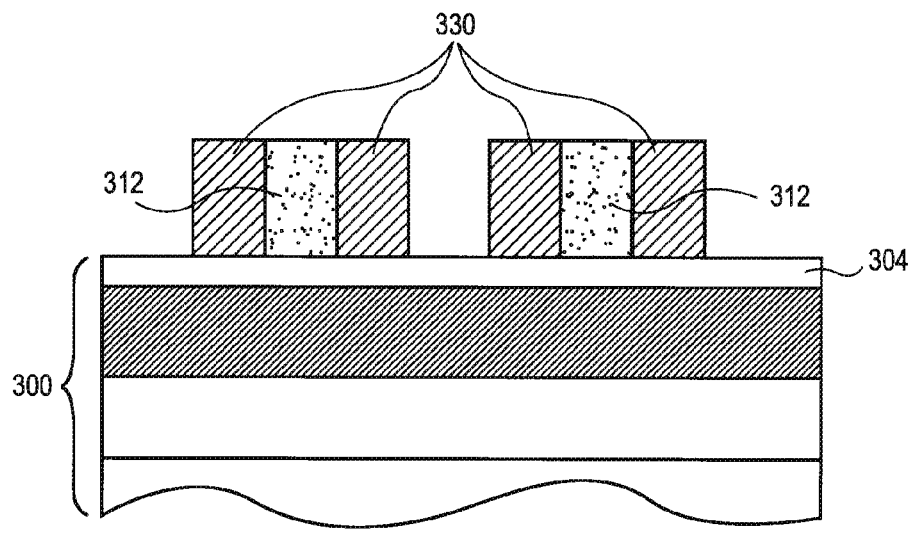

With the spacer layer 320 controlled to the target thickness and/or target uniformity, the adaptive SADP process 200 proceeds to an operation 230 where the substrate is transferred to an etch chamber (e.g., etch chamber 415 of FIG. 4 or a hybrid dep-etch chamber) to be anisotropically etched. As further depicted in FIG. 3E, the spacer layer 320 is etched to form a spacer mask 330. In accordance with an embodiment, the spacer layer 320 is etched to form the spacer mask 330 and to expose the stop layer 304. In one embodiment, the lines of the spacer mask 330 are conformal with the sidewalls of the template mask 312. Thus, there are two lines for the spacer mask 330 for every line of the template mask 312, as depicted in FIG. 3E.

The spacer layer 320 may be etched to provide the spacer mask 330 by any process known capable of providing well-controlled dimensions. For example, in one embodiment, the spacer layer 320 is etched to form the spacer mask 330 by a process that provides a spacer width approximately equal to the width 'x', described above for the target thickness of the spacer layer 320. In a particular embodiment, where template mask 312 is BARC and the spacer layer 320 is composed of silicon dioxide, the spacer layer 320 is etched to form the spacer mask 330 using a dry etch process with a gas such as, but not limited to, $C_4F_8$, $CH_2F_2$ or $CHF_3$. In accordance with an embodiment of the present invention, the spacer layer 320 is etched at least until the template mask 312 is exposed, as depicted in FIG. 3E. The spacer layer 320 may be etched such that the spacer lines of the spacer mask 330 retain a substantial portion of the original thickness of the spacer layer 320. Thus, in a particular embodiment, the width of the top surface of each line of the spacer mask 330 is substantially the same as the width at the interface of the spacer mask 330, as depicted in FIG. 3E.

Following the operation 230, as depicted in FIG. 2, an in-vacuo CD measurement is performed at operation 235. Any of the measurement techniques described in reference to FIG. 4 may be employed at the operation 235. In a particular embodiment, an in-vacuo OCD measurement is performed to generate feedback measurement data $CD_{N-1}$ which is input into an adaptive controller of the operation 230 (e.g., via the look up table 231) to modify at least one parameter of the anisotropic spacer etch process employed for subsequent substrates.

With the spacer mask 330 formed and the CD and/or pitch validated by in-vacuo CD measurement, the template mask 312 and stop layer 304 may then be removed in preparation for patterning the first hardmask layer 306 to complete formation of the SADP hardmask. In one embodiment, as depicted in FIG. 2, the adaptive SADP process 200 may be terminated at operation 260 with an unloading of the substrate from the processing platform prior to such further processing. In alternate embodiments, the same processing platform is further employed to remove the template mask 312, remove the stop layer 304 and pattern the first hardmask layer 306.

Figure 3F:
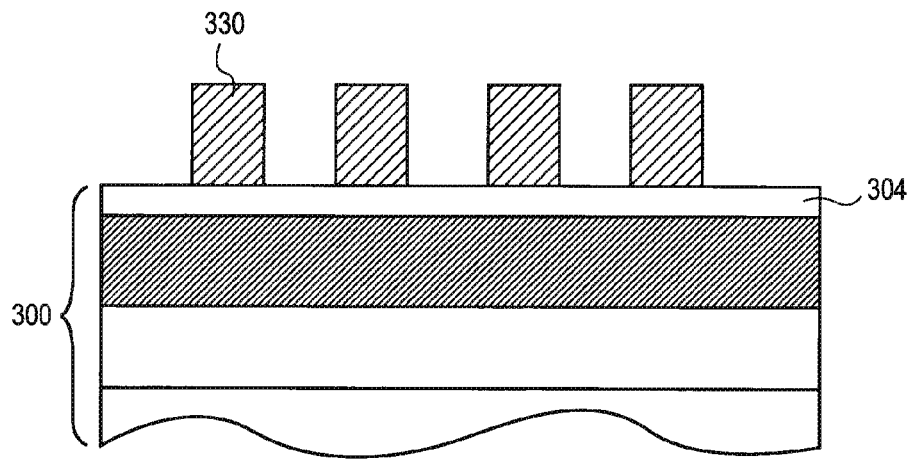

For example, referring to FIG. 3F, the template mask 312 is removed, leaving only the spacer mask 330 over the stack 300. Template mask 312 may be removed by any technique selective to the spacer mask 330. For example, in one embodiment, where the template mask 312 is BARC, it may be removed by a dry oxygen-based strip process, for example in the strip chamber 402 of FIG. 4. The stop layer 304 may then be removed selectively to spacer by any technique selective to the spacer mask 330.

Figure 3G:
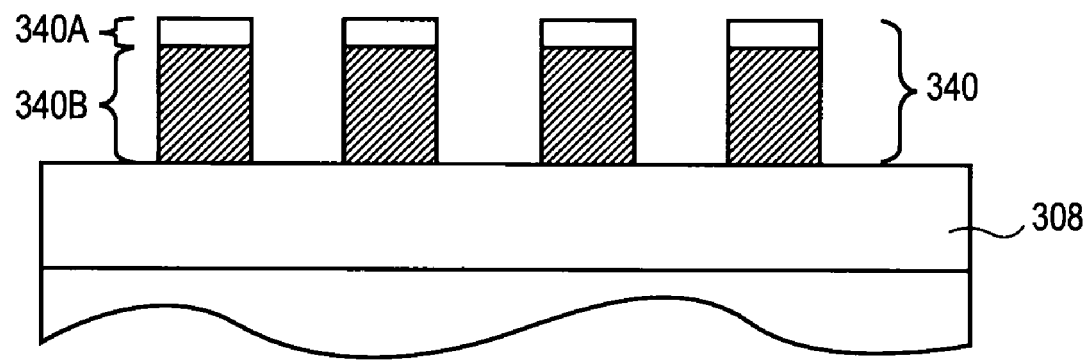

Referring to FIG. 3G, an image of the spacer mask 330 is transferred to the first hardmask layer 306 via the stop layer 304 to form a patterning mask 340. In one embodiment, the patterning mask 340 includes a first hardmask portion 340A and a second hardmask portion 340B, as depicted in FIG. 3G. The image of the spacer mask 330 may be transferred to the first hardmask layer 306 by a process suitable to reliably maintain the pattern and dimensions of spacer mask 330 during the transfer process.

In one embodiment, where the first hardmask layer 306 is amorphous carbon, the image of the spacer mask 330 is transferred by an etch process in a chamber of the processing platform (e.g., etch chamber 420). In a particular embodiment, where the first hardmask layer 306 is composed of amorphous a dry etch process uses a plasma composed of gases such as, but not limited to, the combination of $O_2$ and $N_2$ or the combination of $CH_4$, $N_2$ and $O_2$. In another particular embodiment, the etchant gas mixture consists essentially of $O_2$ and carbonyl sulfide (COS) provides a robust amorphous carbon etch process having a large process window.

In a further embodiment, an additional in-vacuo CD measurement may be performed subsequent to forming the patterning mask 340 as a final CD feedback signal to an integrated SADP process using adaptive process tuning. In one such an embodiment, a process parameter of at least one of the template mask etch, spacer deposition, spacer etch or carbonaceous layer etch performed on a subsequent substrate is adjusted based on the measured final CD.

Figure 3H:
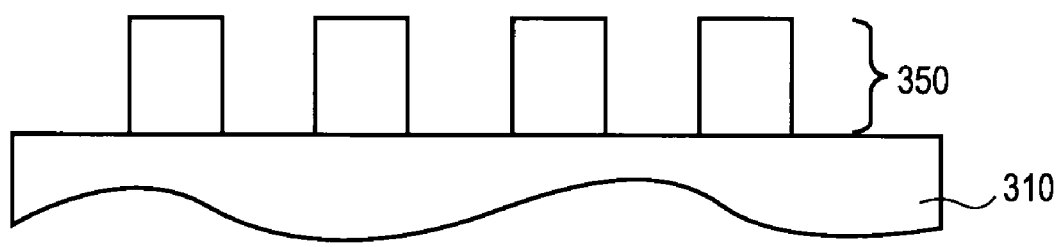

In further embodiments, the spacer mask 330 may also be removed, as depicted in FIG. 3G. In accordance with an embodiment of the present invention, the spacer mask 330 is removed by an etch process similar to the etch process used to etch the spacer layer 320 (e.g., with the etch chamber 415 of FIG. 4) to provide spacer mask 330. The substrate may then be unloaded from the processing platform. The image of the patterning mask 340 may then be transferred to the device layer 308 and provide a patterned device layer 350, as depicted in FIG. 3H. In one embodiment, patterned device layer 350 is disposed over substrate 310.

FIG. 5 illustrates a diagrammatic representation of a machine in the exemplary form of a computer system 500 which may be utilized to control one or more of the operations, process chambers or processing platforms described herein. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the process operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methods or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

The machine-accessible storage medium 531 may further be used to store a set of instructions for execution by a processing system and that cause the system to perform any one or more of the embodiments of the present invention. Embodiments of the present invention may further be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, and flash memory devices, etc.).

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method of self-aligned dual patterning, comprising:
   loading a first substrate into a processing platform;
   etching a first layer of a multi-layered masking stack to form a template mask;

performing an in-vacuo critical dimension (CD) measurement of the template mask;
forming a spacer adjacent to the template mask, the spacer formed to a width that is dependent on the CD measurement of the template mask, wherein forming the spacer adjacent to the template mask further comprises:
depositing a spacer layer over the template mask, wherein spacer layer is formed to a thickness dependent on the CD measurement of the template mask; and
performing a spacer etch to expose the template mask and to form a spacer from the spacer layer;
performing an in-vacuo CD measurement to determine the spacer layer thickness deposited; and
supplementing the thickness of the spacer layer with an additional deposition or isotropically etching the spacer layer, prior to anisotropically etching the spacer layer to form the spacer, based on the measured spacer layer thickness; and
unloading the first substrate from the processing platform.

2. The method as in claim 1, wherein the in-vacuo CD measurement is an optical CD(OCD) measurement.

3. The method as in claim 1, wherein the spacer layer deposition and the spacer etch are performed in a same process chamber.

4. The method as in claim 1, wherein at least one process parameter of the spacer layer deposition is based on the in-vacuo CD measurement of the template mask or at least one process parameter of the spacer etch is determined based the in-vacuo CD measurement of the spacer dielectric layer.

5. The method as in claim 4, wherein the at least one process parameter of the spacer layer etch is selected from the group consisting of: a process time, a process gas flow, an inner:outer RF source coil power ratio, an inner:outer electrode temperature ratio, an inner/outer gas flow ratio and a magnetic field strength.

6. The method as in claim 1, further comprising:
removing the template mask selectively to the spacer and selectively to a stop layer to form a spacer mask;
removing the stop layer to expose a carbonaceous layer of the multi-layered masking stack; and
etching the carbonaceous layer, as defined by the spacer mask, prior to unloading the first substrate.

7. The method as in claim 6, further comprising:
performing an in-vacuo CD measurement after etching the carbonaceous layer to determine the final CD of the patterned multi-layered masking stack; and
adjusting, based on the measured final CD, a process parameter of at least one of the template mask etch, spacer deposition, spacer etch or carbonaceous layer etch performed on a second substrate.

8. A method of self-aligned dual patterning, comprising:
loading a first and second substrate into a processing platform;
etching a first feature into a layer over the first substrate;
performing a first in-vacuo optical critical dimension (OCD) measurement of the first feature;
performing a first deposition of a first film over the first feature;
etching a second feature into a layer over the second substrate, wherein a process parameter of the first film deposition and a process parameter of the second feature etch is dependent on the first OCD measurement;
performing a second in-vacuo OCD measurement of the second feature;
performing a second deposition of a second film over the second feature, wherein a process parameter of the second film deposition is dependent at least one of the first or second OCD measurements;
performing a third in-vacuo OCD measurement characterizing the thickness of the first film; and
performing a spacer etch of the first film to form a first spacer adjacent to the first feature, wherein a process parameter of the spacer etch is dependent on the third OCD measurement; and
unloading the first and second substrates from the processing platform.

9. The method as in claim 8, wherein the first etch and first deposition are performed in a same process chamber or the second etch and second deposition is performed in a same process chamber.

10. The method as in claim 8, wherein at least one process parameter dependent on the first or second OCD measurement is selected from the group consisting of: a process time, a process gas flow, a source to bias power ratio, an inner:outer RF source coil power ratio, an inner:outer electrode temperature ratio, an inner/outer gas flow ratio and a magnetic field strength.

11. The method as in claim 8, wherein a process parameter of the second deposition is dependent on both the first and second OCD measurements.

12. The method as in claim 8, wherein the spacer etch is performed in a same process chamber as the first film deposition.

13. The method as in claim 8, further comprising:
performing a fourth in-vacuo OCD measurement characterizing the spacer pitch and CD;
performing a fifth in-vacuo OCD measurement characterizing the thickness of the second film; and
performing a spacer etch of the second film to form a second spacer adjacent to the second feature, wherein a process parameter of the spacer etch of the second film is dependent on at least one of the fourth and fifth OCD measurements.

14. The method as in claim 13, further comprising:
etching the first substrate using the first spacer as a mask prior to unloading the first substrate from the processing platform; and
etching the second substrate using the second spacer as a mask prior to unloading the second substrate from the processing platform.

15. The method of claim 14, wherein etching the first and second features further comprises etching an amorphous silicon layer or a bottom anti-reflecting coating (BARC), wherein depositing the first and second films further comprises depositing silicon oxide, silicon nitride, silicon oxynitride or silicon carbon nitride and wherein etching the first and second substrates using the first and second spacers as a mask further includes etching a CVD carbon layer.

16. A non-transitory computer readable medium with instructions stored thereon, which when executed by a processing system, causes the system to perform the method of claim 1 or 8.

* * * * *